(12) United States Patent
Bowen

(10) Patent No.: US 12,453,004 B2
(45) Date of Patent: Oct. 21, 2025

(54) WEARABLE DEVICE FOR SPORTS HEADWEAR

(71) Applicant: Head Impact Trauma Limited, Edinburgh (GB)

(72) Inventor: David Euan Murray Bowen, Edinburgh (GB)

(73) Assignee: Head Impact Trauma Limited, Edinburgh (GB)

( * ) Notice: Subject to any disclaimer, the term of this patent is extended or adjusted under 35 U.S.C. 154(b) by 0 days.

(21) Appl. No.: 19/090,317

(22) Filed: Mar. 25, 2025

(65) Prior Publication Data

US 2025/0227839 A1    Jul. 10, 2025

Related U.S. Application Data

(63) Continuation of application No. PCT/GB2023/052483, filed on Sep. 26, 2023.

(51) Int. Cl.
*A42B 3/04* (2006.01)
*A61B 5/00* (2006.01)
(Continued)

(52) U.S. Cl.
CPC ......... *H05K 1/0298* (2013.01); *A42B 3/0406* (2013.01); *A61B 5/0004* (2013.01);
(Continued)

(58) Field of Classification Search
CPC .. H05K 1/0298; H05K 1/0306; H05K 1/0366; H05K 1/115; H05K 2201/10098;
(Continued)

(56) References Cited

U.S. PATENT DOCUMENTS

2002/0007677 A1*  1/2002  Coates ............... G01P 15/0802
                                                            73/514.16
2008/0078570 A1*  4/2008  Japp ..................... H05K 3/4688
                                                                 29/830
(Continued)

FOREIGN PATENT DOCUMENTS

CN    209498680 U    10/2019
CN    213370190 U     6/2021
(Continued)

OTHER PUBLICATIONS

Head Impact Trauma Limited, Intellectual Property Office United Kingdom, Search Report under Section 17(5), 2214026.3, Mar. 24, 2023, 5 pgs.
(Continued)

*Primary Examiner* — Hai V Tran
*Assistant Examiner* — Michael M Bouizza
(74) *Attorney, Agent, or Firm* — SankerIP

(57) ABSTRACT

A wearable device for sports headwear includes a housing and a printed circuit board (PCB). The PCB includes alternating layers of core material substrate and prepreg material substrate. The top and bottom layers comprise core material substrate, and have multiple conducting material layers. The PCB includes electronic components on an upper conducting layer, including an accelerometer for detecting acceleration change of the wearable device. The PCB includes a short-range wireless antenna on a lower conducting layer, for transmitting data indicating acceleration change detected by the accelerometer off-board the wearable device, and a satellite navigation antenna on the lower conducting layer adjacent to the short-range wireless antenna, for tracking movement of the wearable device. The PCB includes via holes, each providing electrical connection between the conducting material layers. Multiple internal conducting layers are arranged using the via holes as ground planes for (Continued)

the short-range wireless antenna and the satellite navigation antenna.

20 Claims, 9 Drawing Sheets

(51) Int. Cl.
| | |
|---|---|
| A61B 5/11 | (2006.01) |
| G01P 15/00 | (2006.01) |
| H01Q 1/27 | (2006.01) |
| H01Q 9/04 | (2006.01) |
| H05K 1/00 | (2006.01) |
| H05K 1/02 | (2006.01) |
| H05K 1/03 | (2006.01) |
| H05K 1/11 | (2006.01) |

(52) U.S. Cl.
CPC .......... *A61B 5/1112* (2013.01); *A61B 5/1126* (2013.01); *H01Q 1/276* (2013.01); *H01Q 9/0414* (2013.01); *H05K 1/0306* (2013.01); *H05K 1/0366* (2013.01); *H05K 1/115* (2013.01); *A61B 2562/0219* (2013.01); *H05K 2201/10098* (2013.01)

(58) Field of Classification Search
CPC ... A42B 3/0406; A61B 5/0004; A61B 5/1112; A61B 5/1126; A61B 2562/0219; H01Q 1/276; H01Q 9/0414
See application file for complete search history.

(56) References Cited

U.S. PATENT DOCUMENTS

| | | | |
|---|---|---|---|
| 2015/0040665 | A1 | 2/2015 | Borkholder et al. |
| 2017/0172222 | A1 | 6/2017 | Morgenthau et al. |
| 2019/0082968 | A1 | 3/2019 | Karnik et al. |
| 2020/0006853 | A1* | 1/2020 | Park .................... H01Q 9/0414 |
| 2021/0280964 | A1* | 9/2021 | Hong ................. H01Q 9/0414 |
| 2022/0181771 | A1* | 6/2022 | Grando ................ H01Q 1/521 |
| 2022/0211135 | A1* | 7/2022 | Bowen ................. A61B 5/103 |
| 2023/0083895 | A1* | 3/2023 | Uhm ................ G02B 27/0176 |
| | | | 345/8 |

FOREIGN PATENT DOCUMENTS

| | | | |
|---|---|---|---|
| WO | WO 2016065102 A1 | | 4/2016 |
| WO | WO 2019053756 A1 | | 3/2019 |
| WO | WO-2019053757 A1 | * | 3/2019 |
| WO | WO 2020217089 A1 | | 10/2020 |
| WO | WO 2021148781 A1 | | 7/2021 |
| WO | WO 2024069152 A1 | | 4/2024 |

OTHER PUBLICATIONS

Head Impact Trauma Limited, International Search Report and Written Opinion, PCT/GB2023/052483, Jan. 31, 2024, 15 pgs.
Head Impact Trauma Limited, International Preliminary Report on Patentability, PCT/GB2023/052483, Mar. 1, 2025, 7 pgs.

* cited by examiner

WEARABLE DEVICE FOR SPORTS HEADWEAR

TECHNICAL FIELD

This application is a continuation of PCT Application PCT/GB/2023/052483, filed Sep. 26, 2023, which claims priority to GB application 2214026.3, filed Sep. 26, 2022.

The present invention relates to a wearable device for coupling to sports headwear that is to be worn on a head of a user and, in particular, to a wearable device comprising a multi-layer printed circuit board (PCB) comprising electronic components including an accelerometer on one side of the PCB and both a short-range wireless antenna and a satellite navigation antenna on an opposite side of the PCB.

BACKGROUND

It has become increasingly common to monitor and track various aspects of individual performance and condition in different types of sporting activity. For instance, with ever-increasing knowledge of the risks surrounding concussion, various devices have been devised for detecting high impacts experienced by an individual, particularly to their head, when the individual is participating in sporting activity, e.g. rugby, soccer, gridiron football, horse riding/racing, cycling, skiing, etc.

In one example, a device is embedded into, or otherwise attached to, headgear—such as a helmet, headguard, or headband—worn by the individual or user when participating in the sporting activity. The device may include an accelerometer for measuring an acceleration experienced by the individual's head and, if the acceleration exceeds a certain threshold value then there is deemed to be a risk of concussion and appropriate notification of the head impact is generated upon the impact being detected. Some devices may include a visual indicator that is configured to provide a visual indication to those in the vicinity of the individual when such an impact has occurred, e.g. a lighting arrangement arranged to switch on when such an impact is detected. Devices may alternatively or additionally include audio and/or haptic feedback generators that are configured to activate upon certain head impacts being experienced.

In certain examples, a device worn by an individual may also have functionality to connect wirelessly to another mobile or static device, e.g. a smartphone. The head-worn device may transmit signals indicative of the levels of impact experienced by the individual wearing the device in real time to the other device. The signals may be transmitted only when impacts above a certain threshold are experienced, or may be transmitted substantially continuously or at defined time intervals to capture all of the impact data. The impact data received at the other device, e.g. smartphone, may be viewed by a user, e.g. in an application of the smartphone, to track impact data over time. Notifications informing the user when impacts over a certain level are experienced may be generated through such a smartphone application.

The transmission of impact data from the head-worn device to another device may typically be over relatively short distances. For instance, in a sport such as rugby, soccer or gridiron football, the head-worn device may be worn by a player or individual on the field of play, and the other device for receiving signals may be in the possession of or near to a coach or spectator at the side or edge of the field of play. The data transmission between devices may therefore use a short-range wireless technology standard or protocol. In particular, the head-worn device may include a Bluetooth® antenna for transmitting the impact detection data to one or other devices over a relatively short range according to the Bluetooth® standard.

It may be further desired to include functionality that monitors or tracks other aspects of an individual's performance during sporting activity via such a head-worn device. For instance, it may be desired to accurately track movement of an individual as they move around a field of play, e.g. during rugby, soccer, gridiron football, etc., or as they traverse a course or track, e.g. during cycling, skiing, etc. It may be desired to track movements such as the speed and/or distance of a sprint, a change in direction, and/or a cornering speed. In order to track such movement sufficiently accurately, satellite positioning or navigation capability may be needed as part of the head-worn device. For instance, it may be desirable to incorporate an antenna capable of operating with a Global Navigation Satellite System (GNSS), such as a Global Positioning System (GPS) antenna, into a head-worn device. It may be desirable to store acquired GPS data on-board the head-worn device, and/or transmit or transfer the data off-board to another device, e.g. a smartphone, where the GPS data over time can be viewed and/or analysed.

There are challenges and constraints associated with providing some or all of the above functionality in a device that is to be worn by an individual during sporting activity. One challenge is to ensure that a Bluetooth® or other short-range wireless antenna included as part of the head-worn device has a sufficiently large range to be able to communicate impact detection data to other devices in the vicinity. For instance, in a case in which a head-worn device needs to communicate impact detection data from an individual on a field of play to another device at the side of the field of play, where the field is for a team sport such as rugby, soccer or gridiron football field, for example, then the range may need to be up to approximately 100 meters. The range may typically be increased by increasing the size of the antenna arrangement; however, a head-worn device of the type described here is typically constrained to be of relatively small size, e.g. having maximum dimensions in certain directions, to ensure it can be incorporated or attached to sports headwear in a manner that does not interfere with the individual's performance, or pose a safety risk, during sporting activity. Also, the increased range of a Bluetooth® antenna cannot come at the expense of the accuracy of a satellite navigation system antenna, e.g. GPS antenna, also to be included in the head-worn device. Indeed, a challenge is to ensure that a Bluetooth® antenna and a GPS antenna do not interfere with one another's operation. A further challenge is to ensure that there is sufficient power available to power the various electronic components of such a head-worn device for a sufficient amount of time, in particular for at least the duration of a certain sporting activity.

It is against this background to which the present invention is set.

SUMMARY OF THE INVENTION

According to an aspect of the present invention there is provided a wearable device for coupling to sports headwear that is to be worn on a head of a user. The device comprises a housing, and a printed circuit board (PCB) housed in the housing. The PCB comprises alternating layers of core material substrate and prepreg material substrate in a stacked arrangement, wherein each of a top layer and a bottom layer of the stacked arrangement is a core material substrate. The PCB comprises a conducting material layer on each side of each of the core material substrates, a lower conducting layer of the conducting material layers being at a first side of the PCB, an upper conducting layer of the conducting material layers being at a second side of the PCB opposite to the first side, and a plurality of internal conducting layers of the conducting material layers being between the upper and lower conducting layers. The PCB comprises a plurality of electronic components arranged on the upper conducting layer, the electronic components comprising an accelerometer configured to detect an acceleration change experienced by the wearable device. The PCB comprises a short-range wireless antenna arranged on the lower conducting layer, the short-range wireless antenna being for transmitting data indicative of the acceleration change detected by the accelerometer off-board the wearable device. The PCB comprises a satellite navigation antenna arranged on the lower conducting layer adjacent to the short-range wireless antenna, the satellite navigation antenna being for tracking movement of the wearable device. The PCB comprises a plurality of via holes each providing electrical connection between the conducting material layers. A plurality of the internal conducting layers may be arranged using the via holes as ground planes for the short-range wireless antenna and the satellite navigation antenna.

The plurality of internal conducting layers may be defined as an equal number of upper internal conducting layers and lower internal conducting layers. The lower internal conducting layers may be between the upper internal conducting layers and the lower conducting layer. Each of the lower internal conducting layers may be arranged using the via holes as ground planes for the short-range wireless antenna and the satellite navigation antenna.

One or more of the upper internal conducting layers may be arranged using the via holes to provide direct current routing for an electrical circuit of the PCB between the electronic components of the PCB.

The PCB may comprise six core material substrates, five prepreg material substrates, and twelve conducting material layers including the upper conducting layer, the lower conducting layer and ten internal conducting layers.

A middle two core material substrates of the six core material substrates may be of equal thickness. The middle two core material substrates may be of greater thickness than the remaining four core material substrates of the six core material substrates.

Each of the six core material substrates may be formed from FR4 glass-reinforced epoxy laminate material.

Upper and lower halves of the stacked arrangement of core material substrates, prepreg material substrates and conducting material layers may be symmetric.

A total thickness of the stacked arrangement of core material substrates, prepreg material substrates and conducting material layers may be no greater than 4000 μm. Optionally, the total thickness may be between 3880 μm and 3890 μm. Further optionally, the total thickness may be approximately equal to 3885 μm.

Each of the five lower internal conducting layers may be arranged using the via holes as ground planes for the short-range wireless antenna and the satellite navigation antenna.

Three of the five upper internal conducting layers may be arranged using the via holes to provide direct current routing for an electrical circuit of the PCB between the electronic components of the PCB. Optionally, the three uppermost internal conducting layers may be arranged to provide the direct current routing.

Two of the five upper internal conducting layers may be arranged using the via holes as ground planes for the short-range wireless antenna and the satellite navigation antenna.

A first via hole of the plurality of via holes may be arranged to provide electrical connection between the upper conducting layer and an uppermost internal conducting layer, adjacent to the upper conducting layer. A second via hole of the plurality of via holes may be arranged to provide electrical connection between the uppermost internal conducting layer and a second uppermost internal conducting layer of the ten internal conducting layers. A third via hole of the plurality of via holes may be arranged to provide electrical connection between the upper conducting layer and a second uppermost internal conducting layer of the ten internal conducting layers.

The plurality of electronic components arranged on the upper conducting layer may comprise a microcontroller unit (MCU). A fourth via hole of the plurality of via holes may be arranged to provide electrical connection between the MCU on the upper conducting layer and the short-range wireless antenna on the lower conducting layer, and between the satellite navigation antenna on the lower conducting layer and a receiver microchip of the satellite navigation antenna on the upper conducting layer.

A fifth via hole of the plurality of via holes may be arranged to provide electrical connection between the lower conducting layer and a lowermost internal conducting layer of the ten internal conducting layers.

One of the internal conducting layers may be provided with a plurality of meandered strips to tune the satellite navigation antenna to a desired bandwidth and to provide circular polarisation of the satellite navigation antenna.

The PCB may comprise four core material substrates, three prepreg material substrates, and eight conducting material layers including the upper conducting layer, the lower conducting layer and six internal conducting layers. At least one of the four core material substrates may comprise ceramic material.

A lowermost two of the four core material substrates may be of greater thickness than an uppermost two of the four core material substrates. One or both of the lowermost two of the four core material substrates may comprise ceramic material. Optionally, one or both of the lowermost two of the four core material substrates may be formed from a ceramic-FR4 hybrid material.

The device may comprise a battery holder arranged to receive a coin battery therein. The battery holder may be offset from the PCB and being connected to the PCB via pins. Optionally, when the coin battery is received in the battery holder a plane of the coin battery may be parallel to a plane of the PCB.

The battery holder may be adjacent to the second side of the PCB.

The housing and the PCB may be of generally circular shape.

A diameter of the PCB may be no greater than 30 millimeters. Optionally, the diameter of the PCB is approximately equal to 29 millimeters.

According to another aspect of the invention there is provided apparatus comprising: sports headwear; and, a wearable device as defined above, the wearable device being coupled to the sports headwear.

The wearable device may be coupled to the sports headwear such that the first side of the PCB faces outwards in a direction away from an internal part of the sports headwear that is for receiving a user's head.

The wearable device may be received into a hole formed in the sports headwear to couple the wearable device to the sports headwear.

The sports headwear may be one of: a helmet; a headband; and, a head guard.

BRIEF DESCRIPTION OF THE DRAWINGS

Examples of the invention will now be described with reference to the accompanying drawings.

DETAILED DESCRIPTION

Figure 1A:
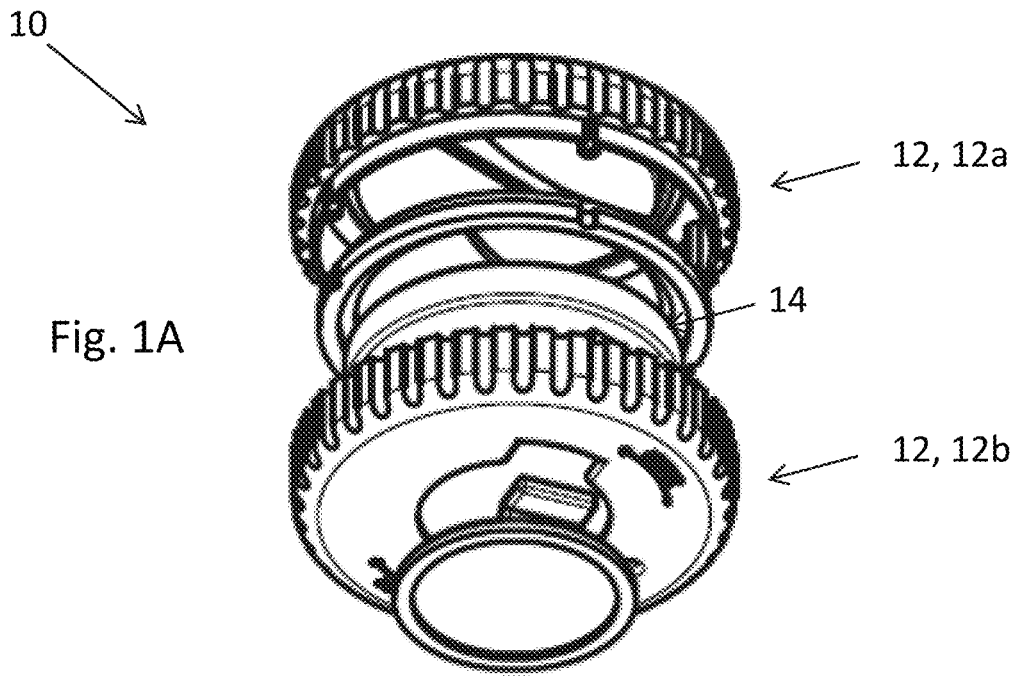
FIGS. 1A and 1B illustrate perspective and side exploded views of a wearable device in accordance with examples of the invention.

Individuals may wear different types of headwear or headgear during different types of sporting activity. The headwear may be worn for various reasons, including to protect the individual's head from injury from impacts suffered while participating in the sporting activity. For instance, helmets including a hard outer shell may be worn in sports such as gridiron football and cycling. Softer shell head guards may be worn in sports such as rugby. Other types of headgear, such as a headband, may be worn by individuals while participating in sporting activity for various reasons such as to keep hair out of the way.

A device or apparatus for monitoring or tracking various aspects of an individual's performance or condition may be coupled (physically or mechanically) to such sports headwear. In one example, the device may be attached to, e.g. by means of a clip, to headgear such as a headband or helmet. In another example, the device may be embedded into a hole or gap formed in headgear such as a (soft or hard shell) helmet. The particular attaching mechanism or technique may be dependent on the type of helmet or the type of sport. For instance, in a contact sport such as rugby then it will not be permitted to have a device attached to an outer part of a rugby headguard for reason of safety of both the individual wearing the headguard and the other players on the field of play.

A known device or apparatus for coupling to sports headwear is an impact detection device that detects a severity of impacts experienced by an individual wearing the headwear while participating in sporting activity. The known device may include a housing or casing with electronic components housed therein. The housing needs to be able to protect the components housed therein, but also needs to be suitable for incorporation into headgear from a safety point of view. The housing may therefore be formed from a flexible material, such as thermoplastic polyurethane (TPU).

The known device may include a printed circuit board (PCB) on which the electronic components are arranged. The PCB is a double-sided or 2 layer PCB. On one side of the PCB there may be an accelerometer that measures or detects acceleration (in three directions). In particular, the accelerometer (or other type of sensor) detects an indication of an acceleration change experienced by the head of an individual wearing the headgear and device. A relatively large head impact experienced by the individual causes a relatively large change in acceleration detected by the accelerometer, and so the accelerometer measurement can be used to detect when the individual has suffered a head impact that may require further investigation, e.g. by a medical professional.

On the same side of the PCB of the known device there may be a visual indicator in the form of a lighting arrangement, e.g. an arrangement of one or more Light Emitting Diodes (LEDs). When the accelerator detects an acceleration above a certain threshold-indicating that a head impact above a certain level of severity has been experienced-then the lighting arrangement may be configured to switch on/light up. The device may be arranged in or on the headgear such that the side of the PCB on which the lighting arrangement is positioned faces outwards, away from the user's head. This ensures that the lighting arrangement is visible to people in the vicinity of the individual wearing the device. Hence, when the lighting arrangement switches on, people in the vicinity of the individual wearing the device are alerted to the fact that the individual has suffered/experienced a head impact of certain severity. This means that the people in the vicinity can ensure that appropriate action is taken, e.g. ensure that the individual is assessed by a coach or medical professional to confirm that they are in a state to continue to participate in the sporting activity, for instance to check that they have not suffered concussion.

In order that the lighting can be viewed through the housing in which the electronic components of the device are housed, a part of the housing adjacent to the side of the PCB on which the lighting arrangement is located may be transparent. This transparent part of the housing—like the rest of the housing—may be formed from a flexible material, such as TPU.

Also on the side of the PCB that has the accelerometer and lighting arrangement there may be a wireless radio transmitter/antenna for transmitting signals off-board the device, e.g. to another device such as a mobile device, e.g. smartphone or tablet device. In particular, the transmitter/antenna may be used to send impact data collected by the PCB to another device. For instance, impact data may be transmitted from the head-worn device to a mobile device of a coach or medical professional at a side of a field of play (soccer, rugby, etc.) or adjacent to a track (cycling, skiing, etc.). The coach or medical professional may then be able to view the received impact data in an application of the mobile device, e.g. an alert may be generated in the mobile device application if the received impact data indicates that a head impact above a certain threshold severity has been experienced. The antenna on the device may be suitable for relatively short-range wireless communication, e.g. a Bluetooth® antenna or a radio-frequency identification (RFID) antenna. For instance, the signals may be in the form of high-frequency sound waves as they may be clearer or have less disruption than other types of signals.

The device may also include a battery to provide power to the electronic components such as the sensor/accelerometer and the visual indicator/lighting arrangement. The battery may be arranged on a side of the PCB opposite to that of the sensor and the visual indicator. The battery may conveniently be a coin cell or button cell battery. In particular, the battery may abut, or be flush against, the side of the PCB opposite to the side with the electronic components in order to provide a compact arrangement. The PCB may include features such as holes to allow the battery to be mounted to/against the PCB surface.

It is desired to provide a device that is to be embedded into, or otherwise attached to, headwear worn by an individual during sporting activity that has additional functionality relative to the known device outlined above. In particular, it is desired to provide a head-worn device in which impact detection data collected by one or more sensors (accelerometers) of the device can be transmitted wirelessly in a reliable manner to another device in the vicinity. Specifically, if the head-worn device is used by an individual participating in sporting activity on a field of play, such as soccer, rugby or gridiron football, then it is desired that wireless communication can at least be performed between the head-worn device and another device, e.g. mobile device, at a side of, or adjacent to, the field of play. Given a typical size of fields of play for such sports, then it may be desired that wireless communication can be performed up to the order of hundreds of meters, e.g. at least 100 meters.

It is also desired to provide a head-worn device that includes an antenna for performing satellite navigation or positioning tracking, such as a Global Positioning System (GPS) antenna. This is to provide functionality to accurately track movements such as the speed and/or distance of a sprint, a change in direction, and/or a cornering speed, of an individual wearing the head-worn device. It is therefore desired to provide a GPS antenna that is capable of sufficiently high performance to achieve this functionality. For instance, the GPS antenna may be required to be capable of tracking position accurately to the order of meters, e.g. accurate to (plus or minus) 1-5 meters, preferably accurate to (plus or minus) 1 meter. It may be desirable to be able to transmit the collected GPS data to another device-such as the mobile device to which the impact data is transmitted-so that the GPS data may be viewed in real time in any suitable format, e.g. a heat map of the areas within a field of play covered by the individual wearing the device.

It may be desired to include storage or memory means, e.g. random access memory (RAM), in the head-worn device to store data collected acceleration data (from the accelerometer) and satellite navigation data collected by the GPS antenna/sensor. The device may be capable of being connected (e.g. by a wiring connection) to another electronic device, e.g. smartphone, laptop, etc., to allow the collected data stored in the memory means to be downloaded/transferred to the other device. It may therefore be desired that such memory means is capable of storing a certain amount of data corresponding to an amount of data that may be collected between subsequent connections of the head-worn device to another device for data transmission. For instance, it may be desired that the internal RAM storage can store at least an amount of data collected for the duration of a particular sporting activity. It may be desired that the internal RAM storage can store data collected over the course of a day, e.g. up to 24 hours of data.

It is desired that the head-worn device is provided with means to power the electronic components of the device for at least a certain amount of time. The power means may preferably be in the form of a rechargeable battery. Similarly to above, it may be desired that one full charge of the battery can power the electronic components for at least the duration of a particular sporting activity. More preferably, the one full charge of the battery can power the electronic components for at least a day, e.g. 24 hours. Conveniently, the battery may be charged—by connection (e.g. a wiring connection) to a charging source—at the same time as data stored in the RAM storage is downloaded/transferred.

The desired functionality outlined above needs to be provided relative to certain constraints. As the device is to be incorporated into, or attached to, sports headwear, then the device needs to be relatively compact so that it does not interfere with the individual's performance, or pose a safety risk, during sporting activity. In this regard, the device may not have sharp edges or corners so that the device does not cause injury if the wearer suffers an impact. Hence, the device may need to have curved edges or sides, e.g. may be of rounded or circular shape. To ensure sufficient compactness, a length and/or breadth of a PCB housing the various electronic components needs to be no greater than a certain value. A maximum length or breadth (i.e. maximum dimension in a plane of the PCB)—or, in the case of a circular PCB, a maximum diameter—may be of the order of tens of millimeters, e.g. no greater than 30 mm. In a specific example, the PCB diameter may be no greater than 29 mm. Also to ensure that the device does not cause injury when head impacts are experienced during use, and to ensure the device is suitable for use in various environmental conditions, an outer housing or casing of the device needs to be formed from a flexible, waterproof material, such as TPU. Also, the required functionality and range of the antennas needs to be provided without the use of external infrastructure such as external gateways, pole or antennas (e.g. to boost signals) so that the device can be used in any given location.

It can be problematic providing a head-worn device having the desired or required functionality while adhering to the necessary constraints. Separate antennas are needed on the device for providing short-range wireless communication (e.g. Bluetooth®) communication and satellite navigation communication (e.g. GPS communication). The different types of communication occur at different wavelengths. 'Off-the-shelf' antenna components with the required range would be too big to fit on a device of the required (maximum) size. Also, to achieve the required range, and/or to ensure that the separate antennas do not interfere with each other's performance (i.e. ensure a certain level of efficiency), an antenna ground (GND) plane (i.e. an area of conducting material connected to a power supply ground terminal to serve as a return path on a PCB) of increased size may be needed, and/or a 'keep-out area' (i.e. an area around the antenna where no other components should be positioned), associated with the antenna(s), of increased size may be needed. However, again this would not be possible within the size constraints of the PCB. Furthermore, a density of the material (e.g. TPU) of a casing of the device that houses the PCB may interfere with operation/performance (signal transmission) of the antennas.

Figure 1B:
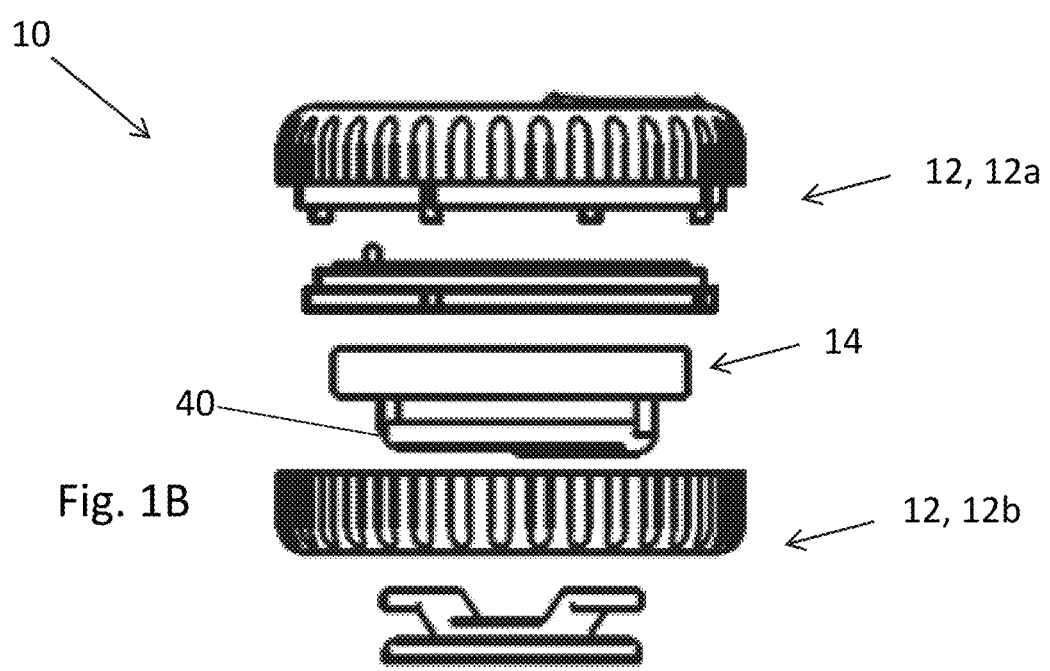

FIGS. 1A and 1B illustrate perspective and side exploded views of a wearable device, arrangement or apparatus 10 in accordance with an example of the present invention. The device 10 is for wearing by a user or individual during (participation in) sporting activity. The wearable device 10 is for embedding in, or for otherwise being attached to, headwear or headgear worn by the user when performing the sporting activity, e.g. a helmet, head guard, headband, etc. The device is therefore coupled to the sports headgear in a suitable manner.

The device 10 includes an outer housing or casing (component) 12 that houses a printed circuit board (PCB) 14 with several electronic components therein. That is, the PCB 14 is inside the housing 12, i.e. the housing 12 encapsulates the PCB 14. In the illustrated example, the housing 12 is of generally circular cross-sectional shape, and in general may have rounded edges. In the illustrated example, the housing 12 is formed from first/upper and second/lower parts/halves 12a, 12b that are brought together and attached to encase the PCB 14 therein. The housing 12 is formed from a flexible, waterproof material. In the described example, the housing 12 is formed from TPU. The device 10 may have a clipping mechanism (not shown) on an outer part of the housing if it is to be clipped onto sports headwear. On the other hand, if the device 10 is to be embedded into sports headwear then no such clipping mechanism is needed. Instead, a suitable hole may be formed in the headwear into which the device is received and secured in an appropriate manner.

The PCB 14 is a multi-layer PCB. By multi-layer PCB is meant a PCB having more than two layers. This is in contrast to previous devices such as the one described above, which has a double-sided (upper and lower outer layers) or 2 layer PCB. The PCB 14 is of generally circular (cross-sectional) shape. In the illustrated example, the PCB 14 has 12 layers: a first outer layer or upper layer; a second outer layer or lower layer; and, 10 intermediate, internal or inner layers. The layers are each of generally circular shape and are arranged in a stacked formation. A diameter of each layer may be no greater than 30 mm. In the described example, the diameter of each layer is approximately 29 mm (e.g. to the closest millimeter).

The number of layers in particular refers to a number of conducting layers of the PCB 14, e.g. metal layers such as copper (foil) layers. In the illustrated example, therefore, the PCB 14 has 12 layers of conductive copper foil or other conductive material. To form a multi-layer PCB, alternating layers of prepreg and core materials may be laminated together under relative high temperature and pressure so that air is not trapped between layers, the conductive material layers are completely encapsulated by resin, and the adhesive that holds the layers together are properly melted and cured. A variety of materials may be used, such as epoxy glass, ceramic or Teflon®. Prepreg and core parts may be formed of similar material; however, the prepreg may not be fully cured. That is, the core layers may be cured while prepreg materials may be malleable, meaning it can easily be formed into sheets. The prepreg material may be impregnated with a resin, where the resin is hardened but left uncured. The prepregs may be regarded as a glue that hold the core materials together.

Figure 2:
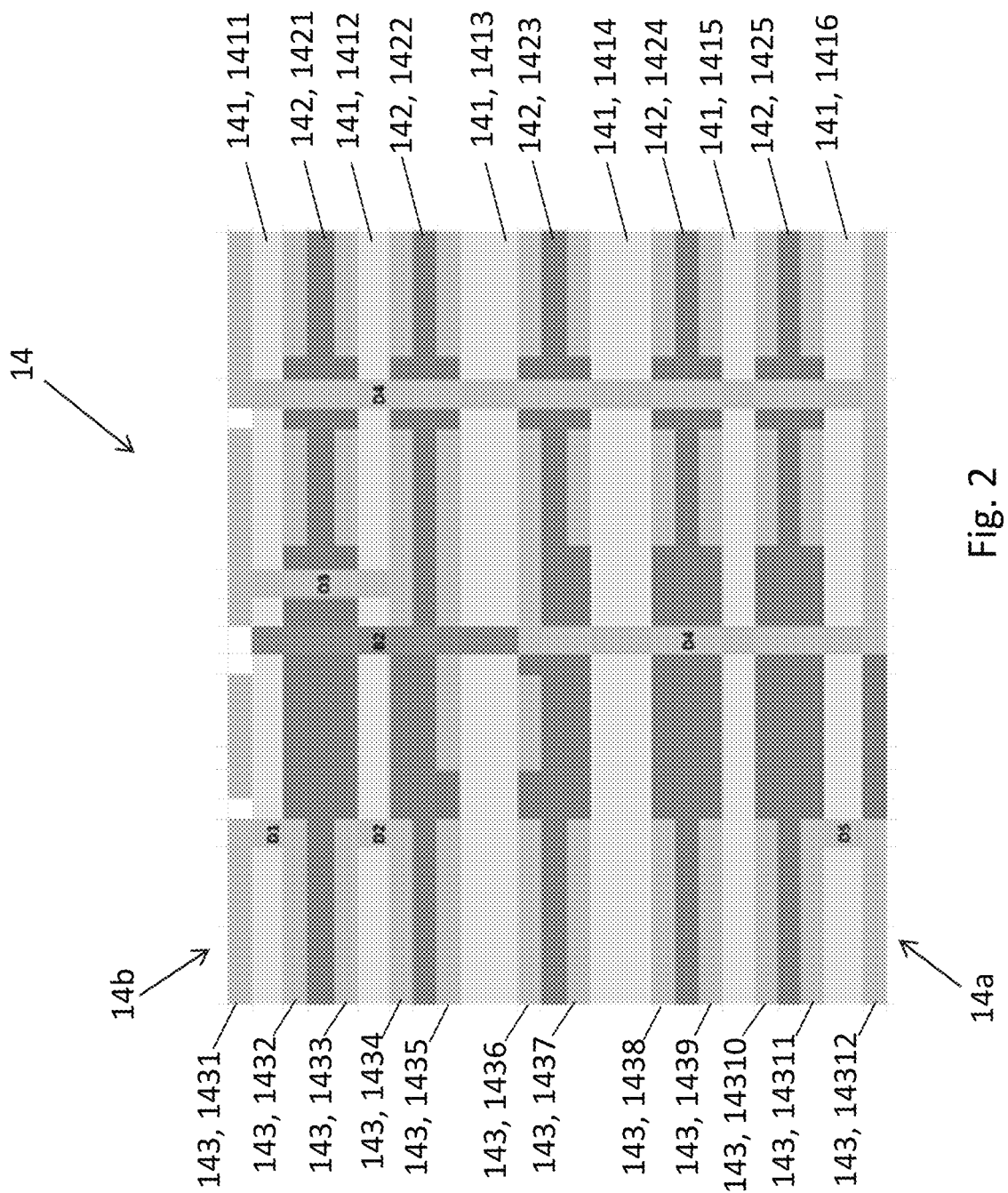
FIG. 2 schematically illustrates a side view of a multi-layer printed circuit board (PCB) of the device of FIG. 1 in accordance with an example of the invention.

FIG. 2 schematically illustrates a side view of the 12 layer PCB 14. In order to provide the 12 layer PCB 14, six cores 141 and five prepregs or laminates 142 are arranged in an alternating layered stack. Each of the cores 141 then has a conducting or metal layer 143 on each side thereof. In the described example, the two cores 1413, 1414 in the middle of the stack—which may be referred to as primary cores—are of greater thickness than the other four (outer) cores 1411, 1412, 1415, 1416. The primary cores 1413, 1414 may be of any suitable thickness, e.g. 800-1200 μm. In the described example, the primary cores 1413, 1414 are approximately 1067 μm. The outer cores 1411, 1412, 1415, 1416 may be of any suitable thickness, e.g. 200-400 μm. In the described example, the outer cores 1411, 1412, 1415, 1416 are approximately 254 μm. In the described example, the cores 141 are formed from FR4 glass-reinforced epoxy laminate material. In the described example, each of the prepregs 142 are of equal thickness. The prepregs 142 may be of any suitable thickness, e.g. 70-120 μm. In the described example, each of the prepregs 142 is approximately 97 μm.

In the described example, the upper layer 1431 and the lower layer 14312 are of equal thickness. In the described example, the upper layer 1431 and the lower layer 14312 are of thickness greater than that of the other, intermediate layers 1432, 1433, 1434, 1435, 1436, 1437, 1438, 1439, 14310, 14311. The outer layers 1431, 14312 may be of any suitable thickness, e.g. 25-50 μm. In the described example, the outer layers 1431, 1432 are approximately 35 μm. The intermediate layers 1432-14311 may be of any suitable thickness, e.g. 10-25 μm. In the described example, the intermediate layers 1432-14311 are approximately 18 μm. The lower layer 14312 may be referred to as being at a lower side or first side 14a of the PCB 14. The upper layer 1431 may be referred to as being at an upper side or second side 14b of the PCB 14.

Each core 141 and prepreg 142 has a suitable dielectric constant. In particular, the dielectric constant of the middle/central (thicker) cores 1413, 1414 may be greater than that of the other (outer) cores 1411, 1412, 1415, 1416. The dielectric constant of the middle cores 1413, 1414 may be 4.2-4.6. In the described example, the dielectric constant of the middle cores 1413, 1414 is approximately 4.34. The dielectric constant of the outer cores 1411, 1412, 1415, 1416 may be 3.8-4.2. In the described example, the dielectric constant of the outer cores 1411, 1412, 1415, 1416 is approximately 4.08. The dielectric constant of each prepreg 142 may be the same. The dielectric constant of each prepreg 142 may be approximately equal to that of the outer cores 1411, 1412, 1415, 1416. In the described example, the dielectric constant of each prepreg 142 is approximately 4.06.

The PCB 14 includes five drills, vias or via holes D1, D2, D3, D4, D5 and one back drill, via or via hole B2, as illustrated in FIG. 2. The drills may be made and plated to form electrical connections. The back drill may be on top of drills to remove an electrical connection. The vias D1-D5 are in the form of two pads in corresponding positions on different layers of the PCB 14, that are electrically connected by a hole through the PCB 14. That is, the vias D1-D5 form electrical connections between layers. The vias D1-D5 may include a conductive tube filling the drilled hole. As illustrated in FIG. 2, a first via D1 forms or provides an electrical connection between the upper layer 1431 and the adjacent (second) layer 1432 (on the other side of the core 1411). The function of the first via D1 is to provide direct current (DC) routing between said layers. In the described example, the first via D1 has a diameter of 100 μm and a pad of 400 μm. A second via D2 forms an electrical connection between the (second) layer 1432 and an adjacent (third) layer 1433, i.e. the layers on opposite sides of the core 1412. The function of the second via D2 is to provide DC routing between said layers. In the described example, the second via D2 has a diameter of 100 μm and a pad of 400 μm. A third via D3 forms an electrical connection between the upper layer 1431 and the (third) layer 1433, i.e. the via D3 extends through the cores 1411, 1412 and the prepreg 1421. The function of the third via D3 is to provide radio frequency (RF) and DC routing between said layers. In the described example, the third via D3 has a diameter of 200 μm and a pad of 400 μm. A fourth via D4 forms an electrical connection between the upper and lower layers 1431, 14312, i.e. the via D4 extends through each of the cores 141 and prepregs 142, and is then back drilled from the lower layer 14312 to the (sixth) layer 1436. The function of the fourth via D4 is to provide RF routing between said layers. In the described example, the fourth via D4 has a diameter of 500 µm and a pad of 600 µm. A fifth via D5 is formed between the lower layer 14312 and the adjacent (eleventh) layer 14311 (on the other side of the core 1416) to provide electrical connection therebetween. In the described example, the fifth via D5 has a diameter of 100 µm, a pad of 400 µm, and an anti-pad of 300 µm. The back drill B2 forms an electrical connection between the upper layer 1431 and the (sixth) layer 1436. In the described example, the back drill B1 has a diameter of 600 µm and an anti-pad of 800 µm. The function of B5 is to provide the D4 via between the (sixth) layer 1436 and the lower layer 14312.

Figure 3A:
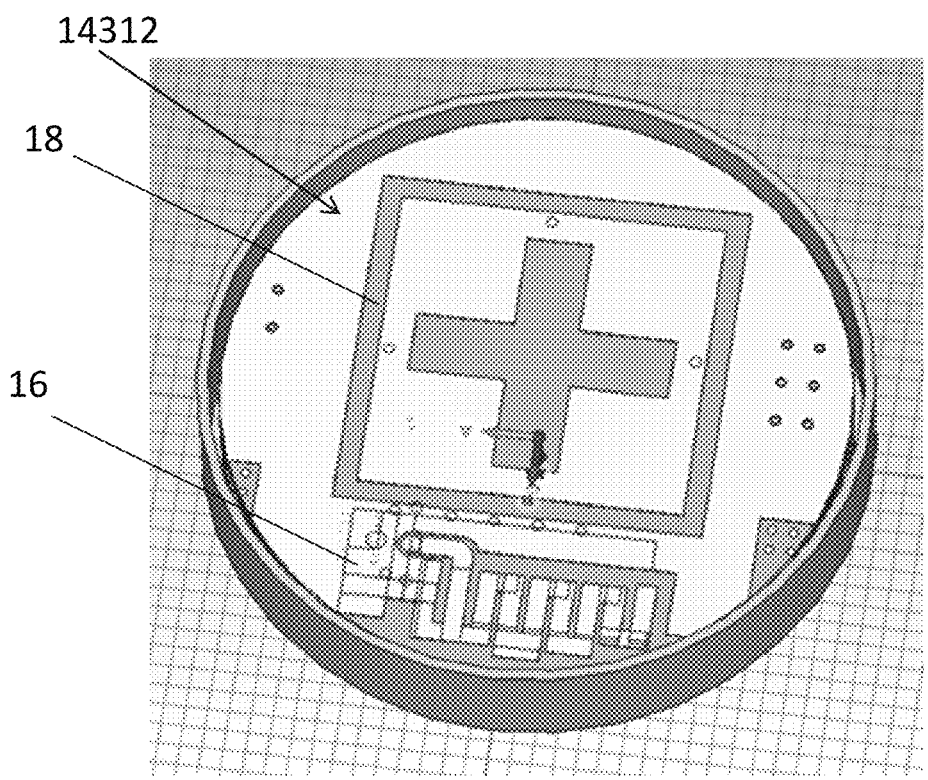
FIG. 3A is a schematic perspective view of the PCB of FIG. 2.
Figure 3B:
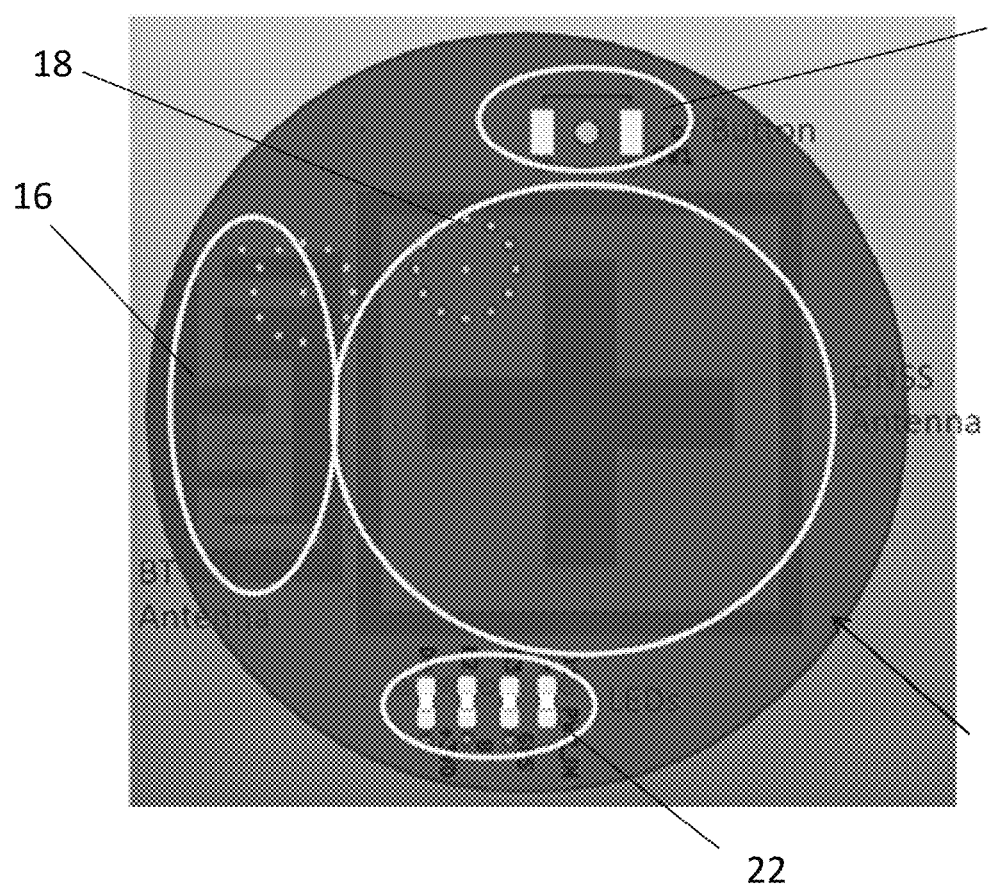
FIG. 3B is a schematic top view of a lower layer of the PCB of FIG. 2.

FIG. 3A shows a schematic perspective view of the PCB 14, in particular showing the lower layer 14312. FIG. 3B shows a schematic top view of the lower layer 14312 of the PCB 14. The PCB 14 includes a (custom) short-range wireless antenna 16 built into its lower layers. In the described example, the antenna 16 is a Bluetooth® (BT) antenna; however, it will be understood that in different examples a different type of short-range wireless antenna may be used, e.g. an RFID antenna. The BT antenna may cover a narrow band, resonating at 2.45 GHz. The BT antenna 16 is positioned adjacent an edge of the lower layer 14312. The structure of the antenna 16 is arranged on the lower layer 14312.

The BT antenna 16 is of folded patch design, in which the functionality of the antenna 16 is provided over multiple layers of the multi-layer PCB 14. This can be used to optimise/reduce the size/area taken up by the patch antenna (microstrip antenna). In particular, folded patch design allows for the fields of the antenna 16 to propagate between two or more layers of the PCB 14 in order that the antenna can be provided as a relatively compact component.

As illustrated in FIGS. 3A and 3B, the lower layer 14312 also includes a (custom) satellite navigation antenna 18 built into its lower layers. In the described example, the antenna 18 is a GPS antenna; however, it will be understood that different types of antenna may be used. The GPS antenna 18 may cover a frequency range of 1.48 GHz to 1.58 GHZ, and may resonate at 1.575 GHz. The GPS antenna 18 is also of folded patch design. The GPS antenna 18 is designed with a suitable update rate to provide the required accuracy; in the described example this is 10 Hz. The structure of the antenna 18 is arranged on the lower layer 14312.

In the described example, the antennas 16, 18 are in particular built across the lower four layers 1439-14312 of the PCB 14. The lower layer 14312 is the primary radiator for both the BT and GPS antennas 16, 18. The intermediate layer 14311 adjacent to the lower layer 14312 (i.e. the second lowest layer) may be regarded as a dummy layer allowing for copper/metal balance. This layer 14311 is also used as a ground plane for the antennas 16, 18. The next intermediate layer 14310 (i.e. third layer from the lower side) is provided with meandered strips—in the described example, four such strips—whose function is to tune the GPS antenna 18 to operate at the correct/desired bandwidth. These strips also provide circular polarisation of the antenna 18, which is required for the context of the present invention, i.e. a head worn (tracking) device. The next intermediate layer 1439 (i.e. fourth layer from the lower side) provides the primary (radio frequency) ground plane for both the BT and antennas 16, 18.

The BT antenna 16 may be particularly sensitive to the positioning of the ground planes and vias underneath the antenna. The GPS antenna 18 may be less sensitive as it primarily relies on its four cross structures and their relative placements to the ground planes. The GPS antenna 18 may beneficially be positioned relatively centrally on the PCB surface to provide the best performance.

The GPS antenna 18 may in particular use the intermediate layers 1434, 1435 as ground, which are immediately adjacent to the 'digital side' of the PCB 14. This provides a relatively large ground plane within the various design constraints. The BT antenna 16 may in particular use the layers 1436, 14312 as ground. This means that connections for some devices/components are routed through the intermediate layer 14311 without cutting into the outer layer 14312 (as cutting into this layer would negatively affect the performance of the BT antenna).

As illustrated in FIG. 3B, the lower layer 14312 also includes a button 20, which is for switching the device 10 on and off. Furthermore, the lower layer 14312 includes a lighting arrangement in the form of an arrangement of one or more light-emitting diodes (LEDs) 22. The LEDs are configured to illuminate upon an acceleration change of the device 10 above a certain (defined) threshold being detected (as described below).

Figure 4:
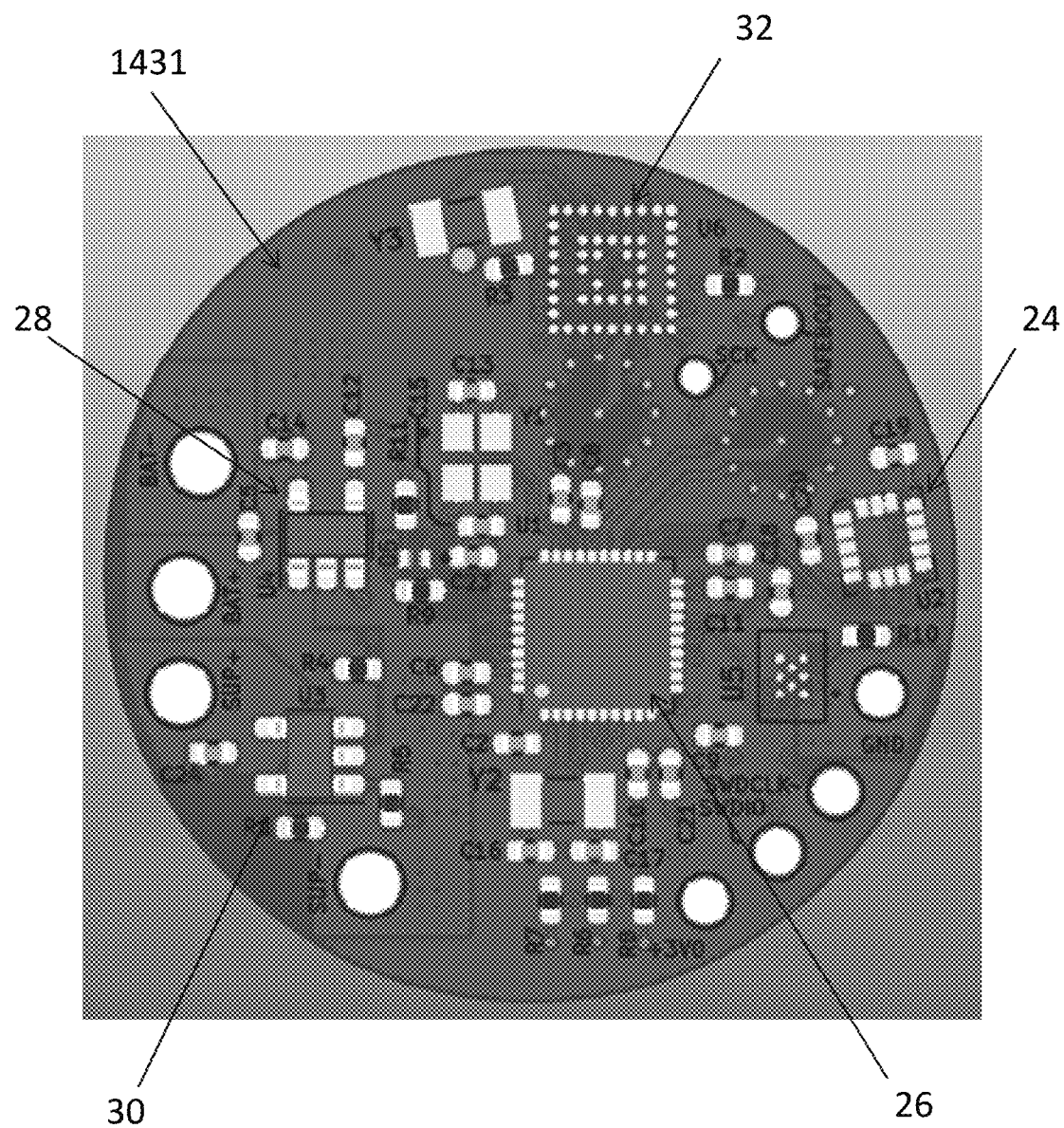
FIG. 4 is a schematic top view of an upper layer of the PCB of FIG. 2.

FIG. 4 is a schematic illustration of a top view of the upper layer 1431 of the PCB 14. The upper layer 1431 includes a number of electronic components (digital electronics) of the device 10. The device 10 includes a sensor in the form of an accelerometer 24. In the described example, the accelerometer 24 is capable of measuring up to 140 G. The device includes a processor module or microcontroller (MCU) 26 of an electrical circuit of the device. The device may include a Random Access Memory (RAM) module for storing data collected by the antennas. The device includes a regulator 28, a battery charger 30 for the battery of the device, and a GPS receiver chip 32.

The vias D1-D3 are for interconnecting different layers of the PCB 14 from the upper layer 1431 to intermediate/internal layers at the digital electronics side. The two D4 vias connect the GPS antenna 18 to the GPS receiver chip on the upper layer 1431 and connect the BT antenna 16 to the microcontroller unit (MCU) on the upper layer 1431.

The function of each of the layers 143 may therefore be summarised as follows. The upper layer 1431 is for housing various electronic components, including the accelerometer 24. The intermediate layers 1432, 1433 are DC power planes/layers for providing power to the electronic components and also provide routing (i.e. electrical connections) between the components. The intermediate layer 1434 is a radio-frequency (RF) ground plane/layer and also provides routing between components. The intermediate layer 1435 is an RF ground layer. The intermediate layer 1436 is a radiator layer. The intermediate layers 1437-14311 are RF ground layers. The lower layer 14312 includes the antennas 16, 18 and is a radiator layer. The intermediate layer 1436 and the lower layer 14312 may together be regarded as forming the radiator structure for the antenna(s).

In previous designs, electronic components and an antenna of such a device may be located on a single side of a PCB, with a battery for powering the electronic components being located at an opposite side of the PCB. In particular, in previous designs a battery holder for holding a battery is located flush against one side of the PCB. In examples of the present invention, one side of the PCB 14 has (BT and GPS) antennas 16, 18, and the opposite side of the PCB 14 has electronic components including an accelerometer 24. As such, a battery holder cannot be located flush against one side of the PCB. In the described example—and as indicated in FIG. 1B—the device 10 includes a battery holder 40 that is offset from the PCB 14 and which is attached or connected to the PCB 14 via pins.

The battery holder 40 receives a battery (not shown in FIG. 1) therein. The battery is a coin battery, also referred to as a button cell. The battery may be of similar diameter to that of the PCB layers. The battery provides power to the electronic components including the accelerometer 24. When the battery is received in the battery holder 40 a plane of the battery is parallel to a plane of the PCB 14, which ensures a compact arrangement.

The battery holder 40 and battery is offset from or adjacent to the upper layer 1431, i.e. the layer including the accelerometer 24 and other electronic components. In this way, the battery and holder do not interfere with operation of the antennas, i.e. the antenna performance is not negatively impacted, which may be the case if the battery and holder were located offset from the lower layer 14312. The battery holder 40 and battery may be offset from the upper layer 1431 by any suitable distance, while overall ensuring a compact device design. The distance may be, for instance 1-2 mm, e.g. approximately 1.7 mm.

In use, the LED arrangement 22 of the device 10 needs to be visible to people in the vicinity of the individual wearing head gear with the attached or embedded device 10. As such, the LED arrangement 22 needs to be arranged on the side of the PCB 14 opposite to the side adjacent which the battery holder 40 and battery 40 are located. Also, the device 10 needs to be attached to or embedded in the head gear such that the side of the PCB 14 on which the LED arrangement 22 is located faces outwards, e.g. away from the individual's head. This is also the case for the on/off switch, so that the device may be activated while being worn. Furthermore, a part of the housing 12 of the device 10 adjacent to the LED arrangement 22 is transparent such that when the LEDs light up it is visible to people in the vicinity. Alternatively, the housing may have a gap through which the LED arrangement is visible. Specifically, in use, when the accelerometer 24 measures an acceleration change greater than a defined threshold change, the PCB 14 is arranged to control the LED arrangement 22 to illuminate so as to draw attention to the fact that the individual wearing the device 10 has experienced a significant (head) impact. In use, the Bluetooth® antenna 16 transmits data indicative of the detected impacts off-board the device, e.g. to a mobile device in the vicinity of the device 10 (e.g. up to 100 meters away). In use, the GPS antenna 18 collects GPS data indicative of movements of the individual wearing the device 10. This collected data may be stored in the on-board RAM of the device, and/or may be transmitted off-board the device (e.g. by the Bluetooth® antenna) to the other mobile device.

The design of the PCB 14 as described above is advantageous in that a small diameter size is maintained—which is crucial for the present context of a device to be worn in head gear—while providing the various desired functionality and, in particular, while increasing the efficiency and accuracy of the performance of both the BT and GPS antennas without there being interference from each antenna. A number of features of the described device give rise to these advantages. The antenna components of the PCB are arranged on an opposite side of the PCB from other digital electronic components of the device, e.g. the accelerometer and MCU. In particular, the antennas are distant from the digital electronics and the battery (i.e. anything that can interact with the antennas and negatively affect their performance). The PCB is a multi-layer PCB, allowing a number of ground planes to be designed into individual (intermediate) layers that allow more ground functionality than would be possible using just a PCB outer layer of small diameter. The ground planes (further) reduce the interaction between the two sides of the PCB (in particular, the components on opposite sides), and provides a ground for the antenna(s) to radiate. As smaller ground planes lead to less efficient antennas and so a lower gain, then building ground plane functionality into the intermediate layers when sufficient area is not available on the surface ensures that antenna performance is maintained and optimised. By having 12 layers as described, a device of overall lower thickness (and so more compact) is realised as thinner cores and more ground plane area is possible relative to a PCB with fewer layers (while achieving/maintaining good antenna performance). The provision of (blind) vias as described allows communication between layers while minimising interference to the antenna side of the PCB. The PCB has been designed so that the BT and GPS antennas may operate alongside one another. The particular antenna geometry ground plane arrangement, and location of the RF vias makes such functionality possible, specifically to reduce mutual coupling by radiated fields as well as internal and surface propagated fields. The antenna is part of the PCB and is not an 'off-the-shelf' component that needs to be integrated, and the antenna will operate alongside any suitable RF integrated circuit (RFIC), thereby reducing cost and allowing for design efficiency to be maximised.

Figure 5A:
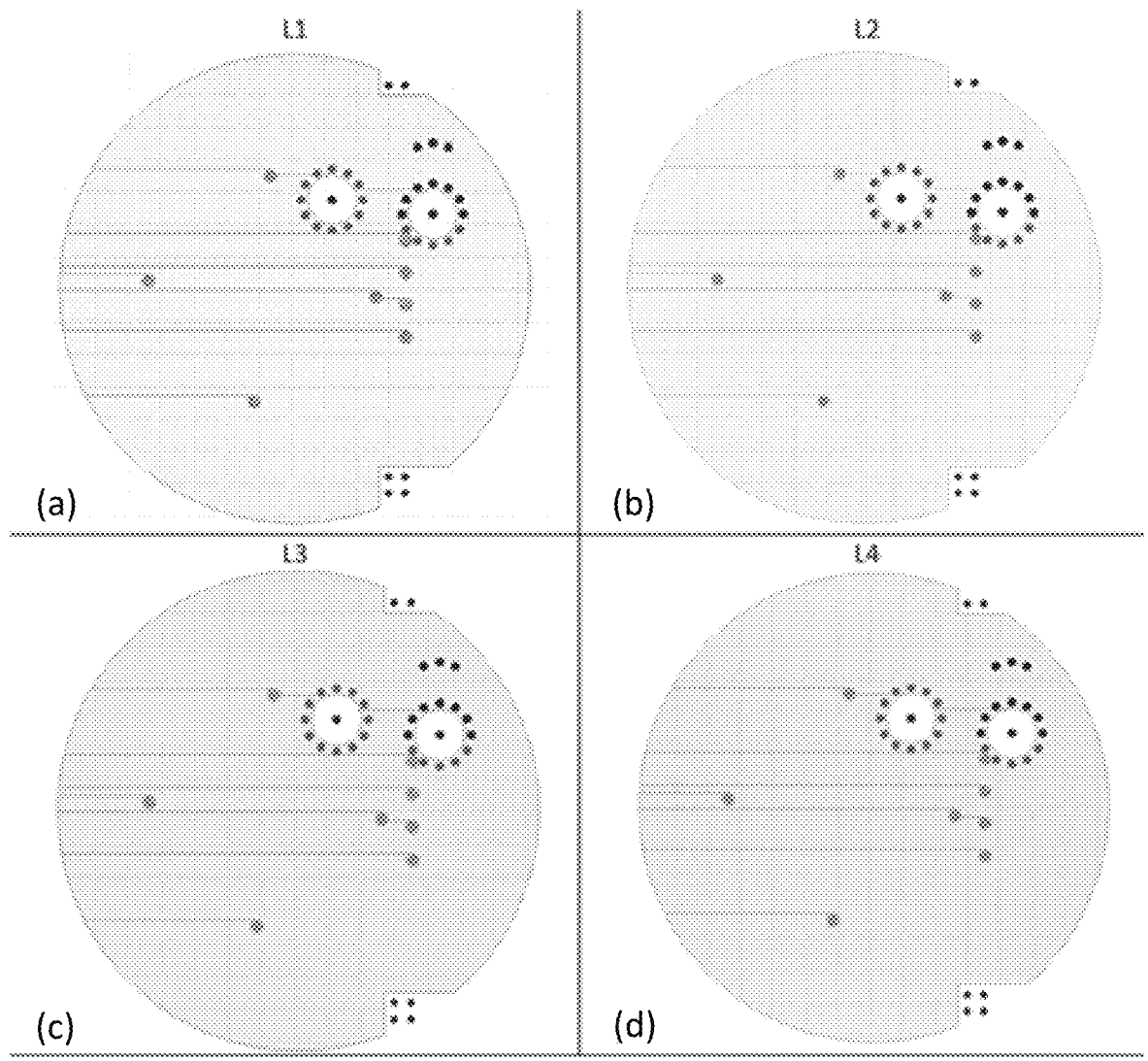
FIGS. 5A-5C provide schematic top views (a)-(l), each corresponding to a respective layer of the PCB of FIG. 2.
Figure 5B:
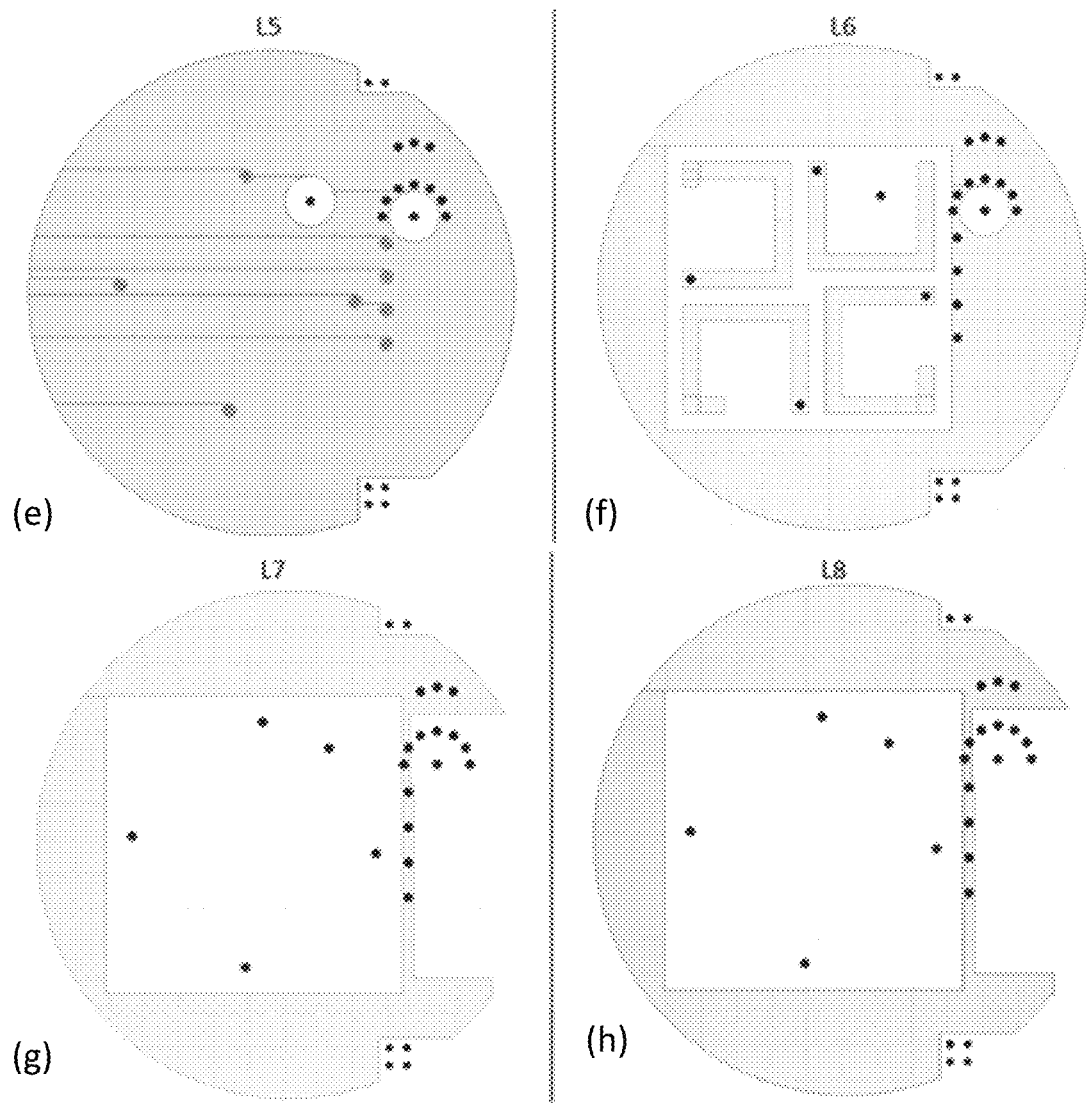
Figure 5C:
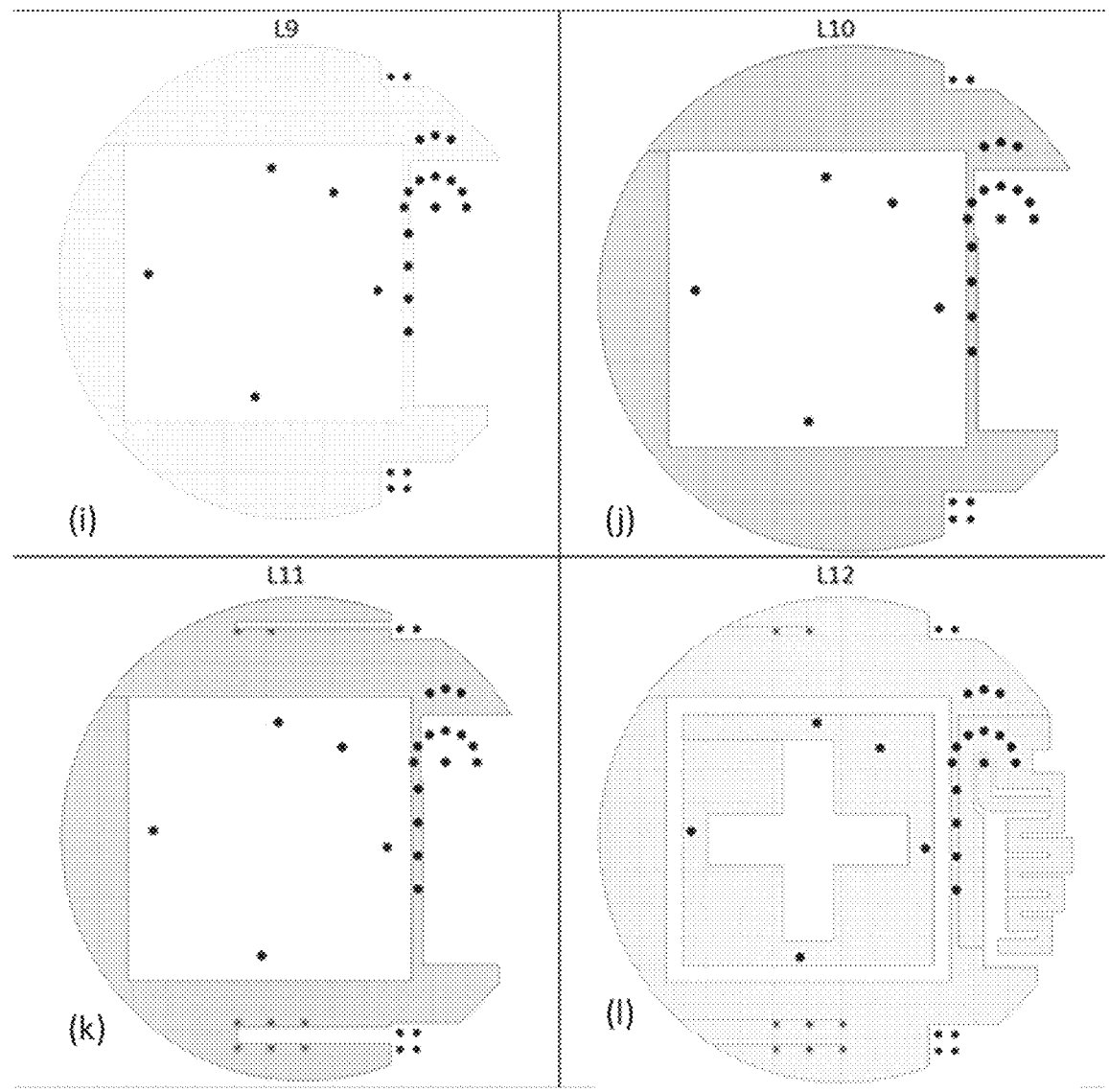

FIGS. 5A-5C schematically illustrate a top view of each of the 12 layers (a)-(l) of the PCB 14 and, in particular, the positioning of the various components and vias. Specifically, layers (a) to (l) respectively show the layers 1431-14312, i.e. from the upper layer 1431 to the lower layer 14312.

Figure 6:
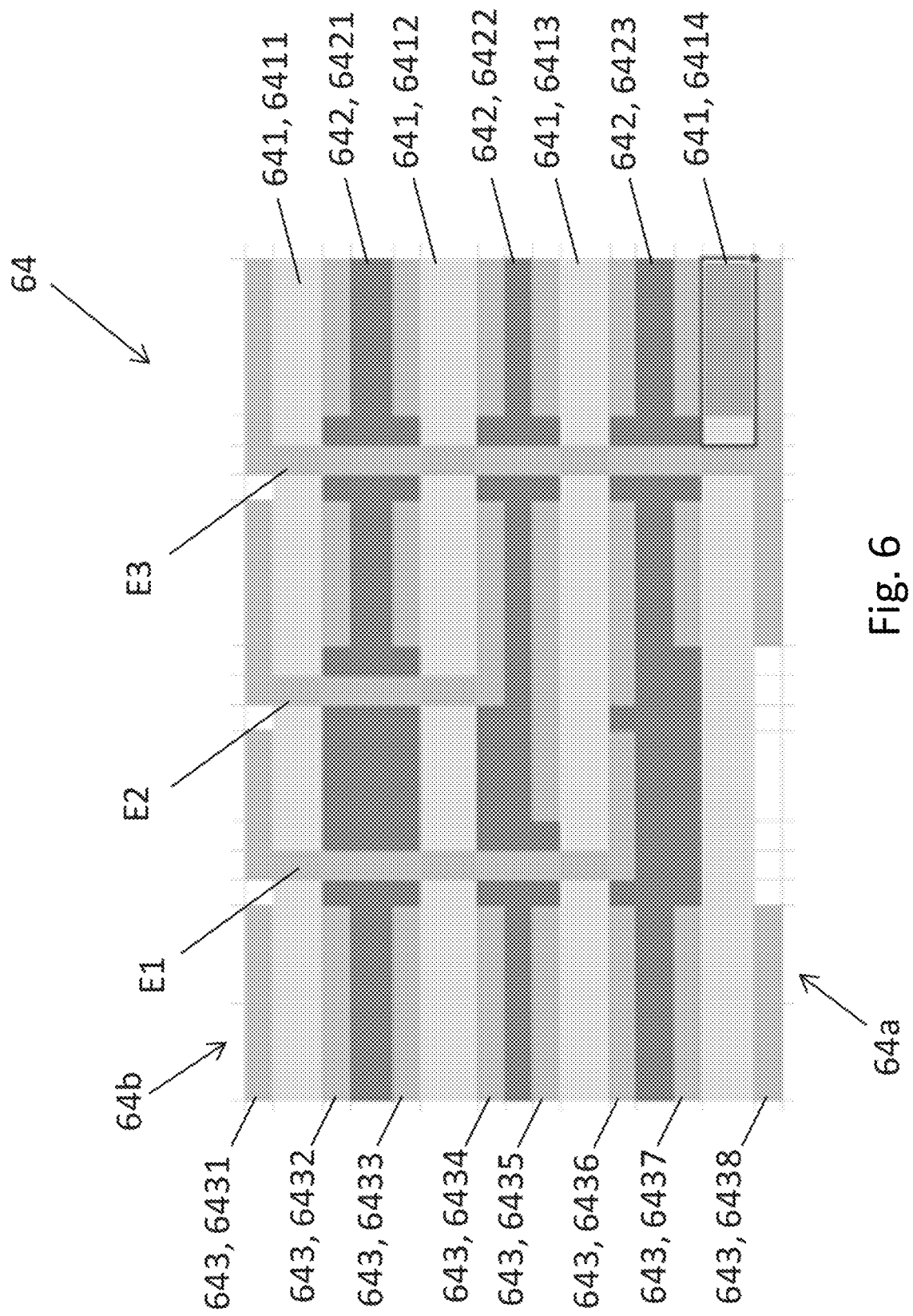
FIG. 6 schematically illustrates a side view of a multi-layer printed circuit board (PCB) of the device of FIG. 1 in accordance with a different example of the invention from FIG. 2.

FIG. 6 schematically illustrates a side view of layers of a PCB 64 in accordance with another example of the invention. The PCB 64 is part of the device 10. In this example, the PCB 64 has four cores 641 and three prepregs 642. Alternating layers of the prepreg and core materials are laminated together and 8 layers 643 of copper material are defined as indicated in FIG. 6.

In the described example, the upper two cores 6411, 6412 are thinner than the lower two cores 6413, 6414. Hence, unlike in the example illustrated in FIG. 2, the PCB 64 stack is not symmetrical in its upper and lower parts. In the presently-described example, the thickness of the upper cores 6411, 6412 may be approximately 250 μm, and the thickness of the lower cores 6413, 6414 may be 1600 μm. Note that the thickness of the lower cores 6413, 6414 is greater than the thickness of any of the cores 143 in the example illustrated in FIG. 2.

Similarly to the example illustrated in FIG. 2, in the described example custom Bluetooth® (BT) and GPS antennas are built into the lower layers of the PCB 64. In particular, in the described example the antennas are built into the lower 4 layers of the 8-layer PCB 64. That is, the lower four layers 6435-6438 are dedicated to antenna performance. The antenna structures themselves are located on the lower layer 6438 and the other of these layers 6435-6437 provide corresponding RF ground planes.

Similarly to the example illustrated in FIG. 2, in the described example digital electronics (or electronic components) such as an accelerometer and MCU are placed on the upper layer 6431 of the PCB stack. The other upper layers 6432-6435 provide digital circuit routing.

While the thickness of the upper cores 6411, 6412 in the vicinity of the digital electronics may be of 'standard' PCB thickness, the thickness of the lower cores 6413, 6414 needs to be determined and selected with respect to the required antenna performance (antenna gain, sensitivity, resonant frequency, etc.).

Similarly to the example illustrated in FIG. 2, in the described example a plurality of vias E1-E3 are provided, The vias are for diverting power away from the antennas to reduce interference noise from other components and antennas of the PCB 64. A first via E1 extends between the upper layer 6431 and the internal (sixth) layer 6436. A second via E2 extends between the upper layer 6431 and the internal (fourth) layer 6434. A third via E3 extends between the upper layer 6431 and the lower layer 6438.

Unlike in the example illustrated in FIG. 2, in the presently-described example (FIG. 6) the lower core 6414 includes ceramic. In particular, the lower core 6414 may be formed from a ceramic-FR4 hybrid material and has a higher dielectric constant that the cores of the example illustrated in FIG. 2. In particular, whereas the dielectric constant of the lower core 6414 may be approximately 10, as mentioned above the dielectric constant of the cores 141 may be approximately 3.8-4.6, for instance. The lower core 6414 may be referred to as an RF shield, and it acts to prevent interference between the antennas and other components. The (third) core 6414 may be a ceramic-FR4 material, or may be formed from FR4 material. The upper two cores 6411, 6412 may be formed from FR4 material.

The lower layer 6438 may be referred to as being at a lower side or first side 64a of the PCB 64. The upper layer 6431 may be referred to as being at an upper side or second side 64b of the PCB 64.

The additional layers in the 12 layer arrangement illustrated in FIG. 2 relative to the 8 layer arrangement illustrated in FIG. 6 allows for a greater amount of ground plane area in the internal layers. In order to achieve the required level of RF performance in the 8 layer arrangement of FIG. 6 (e.g. equivalent to the 12 layer arrangement), to account for the reduced available ground plane and the smaller number of cores, as described above the thickness of one or more cores in the 8 layer arrangement needs to be greater and/or cores of different material having a greater dielectric constant are needed. In certain cases the 8 layer arrangement of FIG. 6 may be regarded as advantageous in that fewer layers are needed, which may be more convenient for manufacture. On the other hand, the 12 layer arrangement of FIG. 2 may be regarded as advantageous in that the stack up is symmetric and that cores of different materials are not needed in order to achieve the required RF performance, which may reduce manufacturing complexity and cost. The symmetric stack up provides balanced copper layers to guard against mechanical deformation. Furthermore, it is the case that the overall thickness of the 12 layer arrangement is smaller than that of the 8 layer arrangement while achieving equivalent RF performance (at least partly because of the increased number of ground plane layers that are possible in the 12 layer arrangement), and so the 12 layer arrangement benefits from being relatively compact, as required for the present context.

Figure 7:
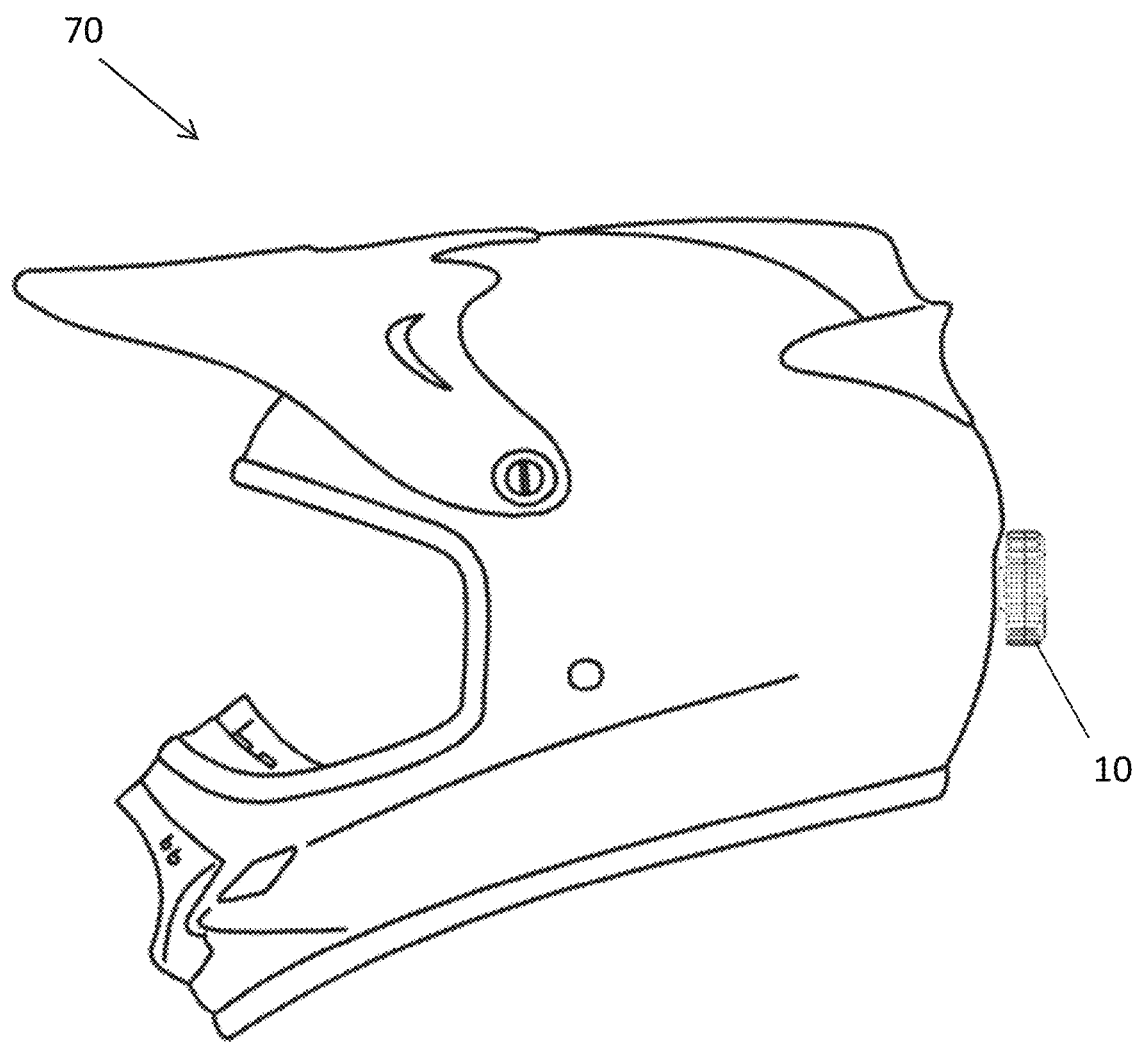
FIG. 7 is a schematic illustration of sports headwear with the device of FIG. 1 coupled thereto.

FIG. 7 shows a schematic illustration of headwear that may be worn by an individual or user on their head during sporting activity. In particular, FIG. 7 shows a side view of a helmet 70, where the device 10 is attached at a rear side of the helmet 70, e.g. by a clipping mechanism. The device 10 may be attached to the helmet 70 such that a side of the PCB 14 on which the antennas 16, 18 are located face outwards away from the helmet 70. It will be understood that the device may alternatively be attached at a different location on the helmet 70. In the illustrated example, the helmet is a cycling helmet; however, different types of sports headwear may have the device 10 attached thereto. Furthermore, the device 10 may alternatively be embedded into sports headwear instead of being attached thereto. This may be the case for contact sports such as rugby, gridiron football, soccer, etc., where embedding the device into headwear protects the wearer and other participants from coming into contact with the device.

The optimal arrangement for a PCB (i.e. number of core, prepreg and conducting layers, materials used, layer thicknesses, arrangement of vias, etc.) that exhibits the required performance capabilities and characteristics outlined above (sufficient antenna accuracy/range, etc.) while adhering to the constraints inherent to the present context (compactness, etc.) may be found using optimisation or simulation tools, a 3D electromagnetic simulator. Parameters defining the arrangement of PCB may be adjusted to optimise scattering parameters (S-parameters) of the RF electronic circuit. The electric and magnetic fields may also be optimised as part of this process, while surface currents may also be taken into account.

Many modifications may be made to the described examples without departing from the scope of the appended claims.

In the described examples, the multi-layer PCB is formed by alternating layers of core and prepreg material substrates. It will be understood that, in general, the multi-layer PCB is formed by a stack of a plurality of substrates or substrate layers (of suitable material, where the substrate layers may be all the same or different materials). The substrates or substrate layers may be referred to as insulating layers. The stacked formation is arranged to have a core material layer as each of the uppermost and lowermost layer, i.e. the top and the bottom layer of the stack is a core material layer. Each substrate has a conducting layer (e.g. copper or other metal layer) on either side thereof. The multi-layer PCB is a laminated sandwich structure of the conducting and insulating layers.

Although examples of multi-layer PCBs having a total of 12 layers and 8 layers are described above, it will be understood that in different examples of the invention a PCB having two outer layers and a different number of intermediate layers may be provided. For instance, in examples of the invention multi-layer PCBs having a total of 4, 6, 10, 14, 16, etc. layers may be provided. The examples described herein have been designed to optimise the various required performance characteristics and functionality while adhering to the constraints of the context in which the PCB is to be used.

The invention claimed is:

1. A wearable device for coupling to sports headwear that is to be worn on a head of a user, the wearable device comprising:
   a housing; and
   a printed circuit board (PCB) housed in the housing, the PCB comprising:
      alternating layers of core material substrate and prepreg material substrate in a stacked arrangement, wherein each of a top layer and a bottom layer of the stacked arrangement is a core material substrate;
      a conducting material layer on each side of each of the core material substrates, a lower conducting layer of the conducting material layers being at a first side of the PCB, an upper conducting layer of the conducting material layers being at a second side of the PCB opposite to the first side, and a plurality of internal conducting layers of the conducting material layers being between the upper and lower conducting layers;

a plurality of electronic components arranged on the upper conducting layer, the electronic components comprising an accelerometer configured to detect an acceleration change experienced by the wearable device;

a short-range wireless antenna arranged on the lower conducting layer, the short-range wireless antenna being for transmitting data indicative of the acceleration change detected by the accelerometer off-board the wearable device;

a satellite navigation antenna arranged on the lower conducting layer adjacent to the short-range wireless antenna, the satellite navigation antenna being for tracking movement of the wearable device; and a plurality of via holes each providing electrical connection between the conducting material layers;

wherein a plurality of the internal conducting layers are arranged using the via holes as ground planes for the short-range wireless antenna and the satellite navigation antenna.

2. The wearable device according to claim 1, the plurality of internal conducting layers being defined as an equal number of upper internal conducting layers and lower internal conducting layers, the lower internal conducting layers being between the upper internal conducting layers and the lower conducting layer, wherein each of the lower internal conducting layers are arranged using the via holes as ground planes for the short-range wireless antenna and the satellite navigation antenna.

3. The wearable device according to claim 2, wherein one or more of the upper internal conducting layers are arranged using the via holes to provide direct current routing for an electrical circuit of the PCB between the electronic components of the PCB.

4. The wearable device according to claim 1, wherein the PCB comprises six core material substrates, five prepreg material substrates, and twelve conducting material layers including the upper conducting layer, the lower conducting layer and ten internal conducting layers.

5. The wearable device according to claim 4, wherein a middle two core material substrates of the six core material substrates are of equal thickness, wherein the middle two core material substrates are of greater thickness than the remaining four core material substrates of the six core material substrates.

6. The wearable device according to claim 4, wherein each of the six core material substrates are formed from FR4 glass-reinforced epoxy laminate material.

7. The wearable device according to claim 4, wherein upper and lower halves of the stacked arrangement of core material substrates, prepreg material substrates and conducting material layers are symmetric.

8. The wearable device according to claim 4, wherein a total thickness of the stacked arrangement of core material substrates, prepreg material substrates and conducting material layers is no greater than 4000 µm; optionally, wherein the total thickness is between 3880 µm and 3890 µm; further optionally, wherein the total thickness is approximately equal to 3885 µm.

9. The wearable device according to claim 4, wherein each of the five lower internal conducting layers are arranged using the via holes as ground planes for the short-range wireless antenna and the satellite navigation antenna.

10. The wearable device according to claim 4, wherein three of the five upper internal conducting layers are arranged using the via holes to provide direct current routing for an electrical circuit of the PCB between the electronic components of the PCB; optionally, wherein the three uppermost internal conducting layers are arranged to provide the direct current routing.

11. The wearable device according to claim 4, wherein two of the five upper internal conducting layers are arranged using the via holes as ground planes for the short-range wireless antenna and the satellite navigation antenna.

12. The wearable device according to claim 4, wherein:
a first via hole of the plurality of via holes is arranged to provide electrical connection between the upper conducting layer and an uppermost internal conducting layer, adjacent to the upper conducting layer;
a second via hole of the plurality of via holes is arranged to provide electrical connection between the uppermost internal conducting layer and a second uppermost internal conducting layer of the ten internal conducting layers; and,
a third via hole of the plurality of via holes is arranged to provide electrical connection between the upper conducting layer and a second uppermost internal conducting layer of the ten internal conducting layers.

13. The wearable device according to claim 4, wherein the plurality of electronic components arranged on the upper conducting layer comprises a microcontroller unit (MCU), wherein a fourth via hole of the plurality of via holes is arranged to provide electrical connection between the MCU on the upper conducting layer and the short-range wireless antenna on the lower conducting layer, and between the satellite navigation antenna on the lower conducting layer and a receiver microchip of the satellite navigation antenna on the upper conducting layer, and wherein a fifth via hole of the plurality of via holes is arranged to provide electrical connection between the lower conducting layer and a lowermost internal conducting layer of the ten internal conducting layers.

14. The wearable device according to claim 4, wherein one of the internal conducting layers is provided with a plurality of meandered strips to tune the satellite navigation antenna to a desired bandwidth and to provide circular polarisation of the satellite navigation antenna.

15. A wearable device according to claim 1, wherein the PCB comprises four core material substrates, three prepreg material substrates, and eight conducting material layers including the upper conducting layer, the lower conducting layer and six internal conducting layers, wherein at least one of the four core material substrates comprises ceramic material.

16. The wearable device according to claim 15, wherein a lowermost two of the four core material substrates are of greater thickness than an uppermost two of the four core material substrates, wherein one or both of the lowermost two of the four core material substrates comprise ceramic material; optionally, wherein one or both of the lowermost two of the four core material substrates are formed from a ceramic-FR4 hybrid material.

17. The wearable device according to claim 1, the device comprising a battery holder arranged to receive a coin battery therein, the battery holder being offset from the PCB and being connected to the PCB via pins; optionally, wherein when the coin battery is received in the battery holder a plane of the coin battery is parallel to a plane of the PCB.

18. The wearable device according to claim 17, wherein the battery holder is adjacent to the second side of the PCB.

19. The wearable device according to claim 1, wherein the housing and the PCB are of generally circular shape, and wherein a diameter of the PCB is no greater than 30 millimeters.

20. An apparatus, comprising sports headwear and a wearable device coupled to the sports headwear, wherein the sports headwear is configured to be worn on a head of a user and the wearable device comprises:
   a housing; and
   a printed circuit board (PCB) housed in the housing, the PCB comprising:
      alternating layers of core material substrate and prepreg material substrate in a stacked arrangement, wherein each of a top layer and a bottom layer of the stacked arrangement is a core material substrate;
      a conducting material layer on each side of each of the core material substrates, a lower conducting layer of the conducting material layers being at a first side of the PCB, an upper conducting layer of the conducting material layers being at a second side of the PCB opposite to the first side, and a plurality of internal conducting layers of the conducting material layers being between the upper and lower conducting layers;
      a plurality of electronic components arranged on the upper conducting layer, the electronic components comprising an accelerometer configured to detect an acceleration change experienced by the wearable device;
      a short-range wireless antenna arranged on the lower conducting layer, the short-range wireless antenna being for transmitting data indicative of the acceleration change detected by the accelerometer off-board the wearable device;
      a satellite navigation antenna arranged on the lower conducting layer adjacent to the short-range wireless antenna, the satellite navigation antenna being for tracking movement of the wearable device; and
      a plurality of via holes each providing electrical connection between the conducting material layers;
   wherein a plurality of the internal conducting layers are arranged using the via holes as ground planes for the short-range wireless antenna and the satellite navigation antenna.

* * * * *